US00RE44051E

(19) United States
(12) Reissued Patent
Kim

(10) Patent Number: US RE44,051 E
(45) Date of Reissued Patent: Mar. 5, 2013

(54) DATA BUS LINE CONTROL CIRCUIT

(75) Inventor: Tae Yun Kim, Ichon-shi (KR)

(73) Assignee: 658868 N.B. Inc., St. John

(21) Appl. No.: 13/335,207

(22) Filed: Dec. 22, 2011

Related U.S. Patent Documents

Reissue of:
(64) Patent No.: 6,363,451
Issued: Mar. 26, 2002
Appl. No.: 09/329,263
Filed: Jun. 28, 1999

(30) Foreign Application Priority Data

Jun. 29, 1998 (KR) ..... 98-24836

(51) Int. Cl.
*G06F 13/38* (2006.01)
*G06F 13/40* (2006.01)

(52) U.S. Cl. ..... 710/305; 710/300; 710/316; 710/317; 345/545; 365/189.04

(58) Field of Classification Search ..... 710/100, 710/300, 305, 316, 317; 711/154, 168; 365/189.04, 365/189.17, 205, 207; 345/545
See application file for complete search history.

(56) References Cited

U.S. PATENT DOCUMENTS 5,404,338 A 4/1995 Murai et al.
5,579,473 A * 11/1996 Schlapp et al. ..... 345/557
5,613,077 A * 3/1997 Leung et al. ..... 710/305
6,226,203 B1 * 5/2001 Kikutake et al. ..... 365/189.14
6,600,671 B2 * 7/2003 Keeth ..... 365/51

* cited by examiner

*Primary Examiner* — Glenn A Auve

(57) ABSTRACT

A data bus line control circuit prevents a problem of a data access operation on a global data bus (GDB) line although two blocks are simultaneously selected. The data bus line control circuit includes: a global data bus line which is arranged between memory units adjacent to each other as two pairs, and transmits a data from a local data bus line positioned between adjacent sub blocks; and transmission means which is connected between the local data bus line and the global data bus line, and transmits bit line signals of two sub blocks to one pair of global data bus lines different from each other through the local data bus line, when the two sub blocks are simultaneously selected by a block isolation selection signal. As a result, a circuit arrangement and a layout design become simplified, and two operations of 8K refresh and 4K refresh are possible in one chip, therefore, two kinds of effects can be achieved by one chip.

10 Claims, 6 Drawing Sheets

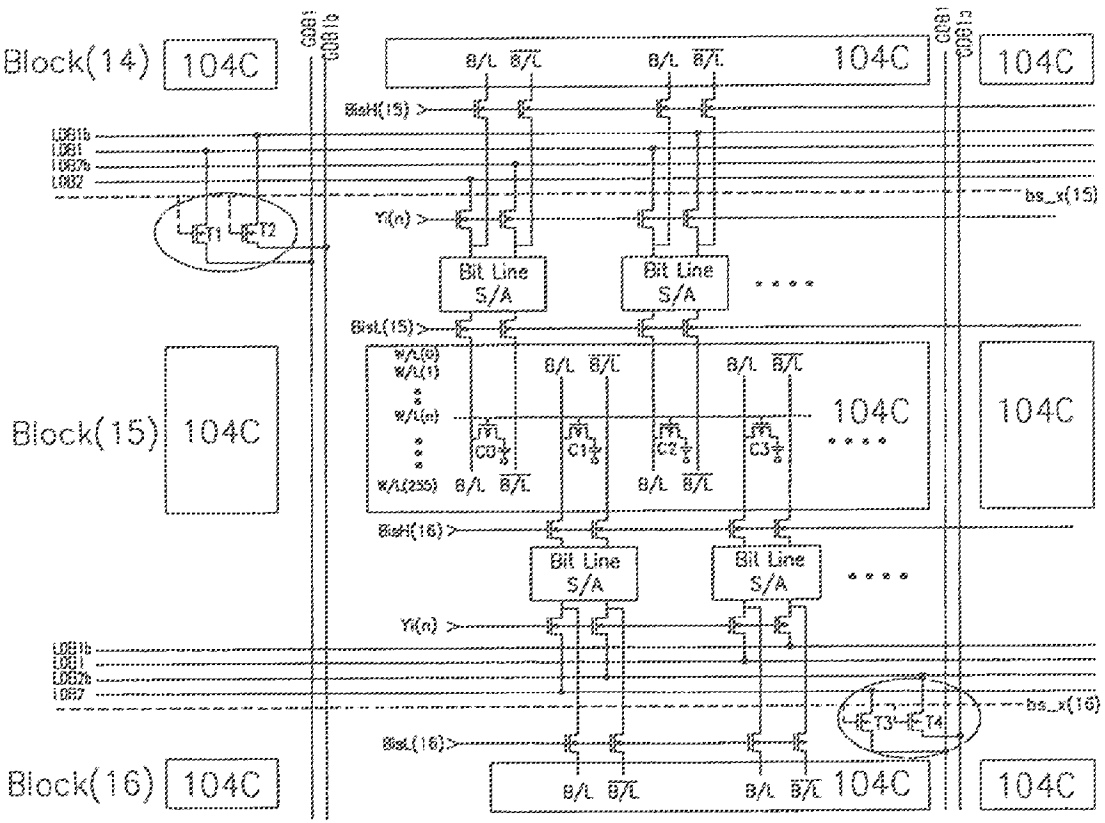
Fig. 2
(Amended)
(prior art)

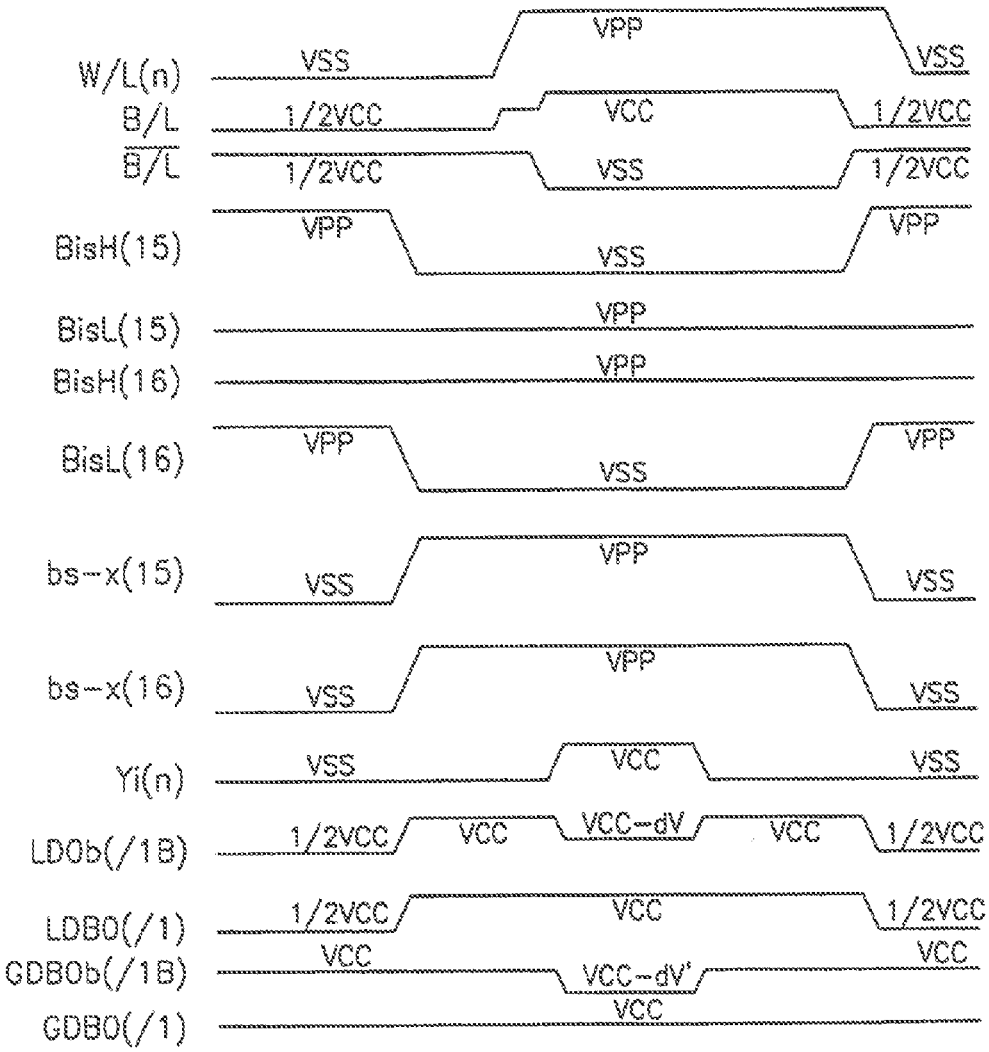
Fig. 3
(Amended)
(prior art)

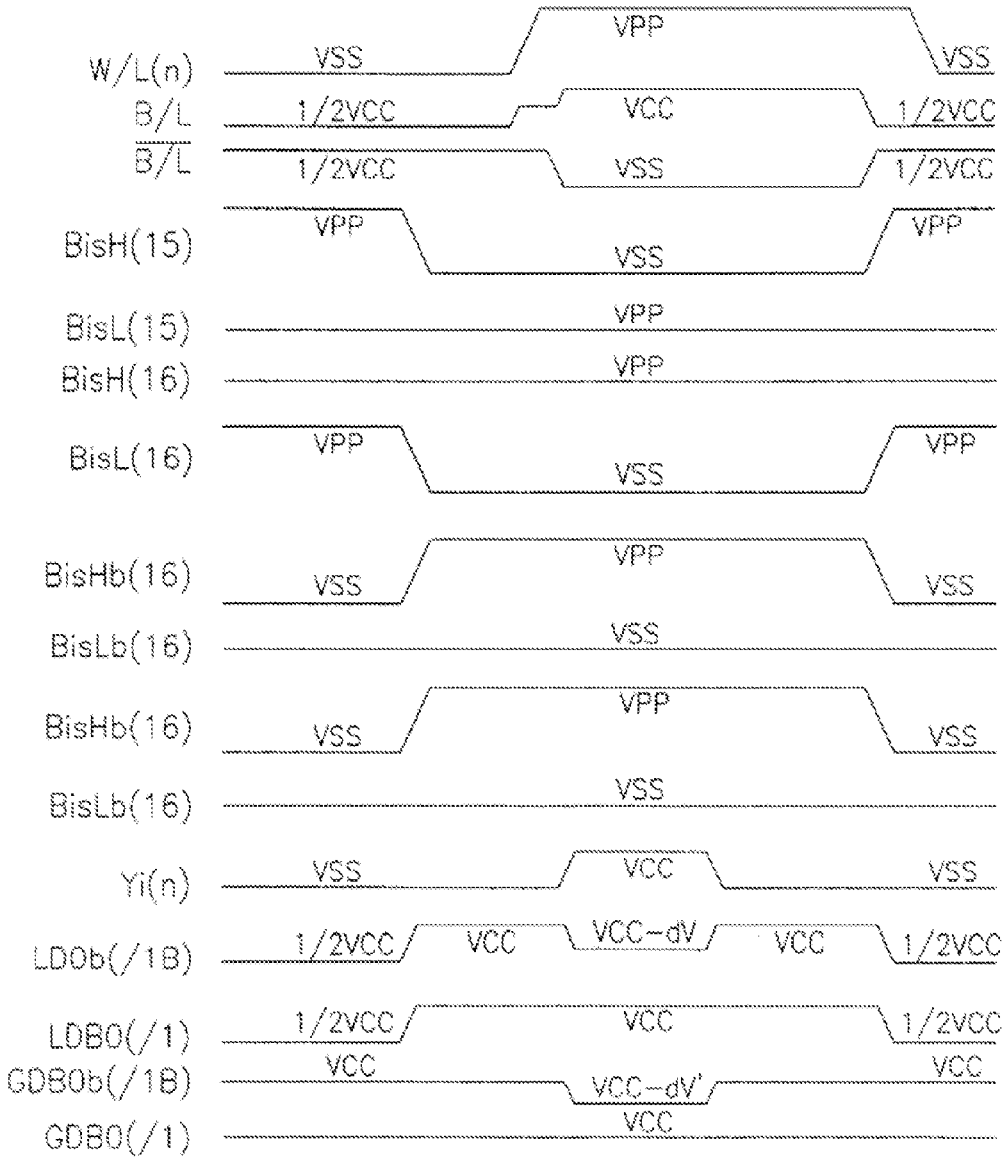
Fig. 6
(Amended)

DATA BUS LINE CONTROL CIRCUIT

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to a data bus line control circuit. More particularly, it relates to a data bus line control circuit which enables both 8K refresh operation and 4K refresh operation to be performed in one element.

2. Description of the Prior Art

As a word line form has been increasingly developed from a metal strapping method to a sub word line scheme, a memory cell array and a global data bus line have been used as a structure of FIG. 1.

FIG. 1 schematically illustrates a connection method between a local data bus line and a global data bus line, and representatively illustrates a structure of 64M dynamic random access memory (DRAM).

Referring to FIG. 1, a memory element (i.e., DRAM) includes: a memory unit; a plurality of row decoders 10, 12, 14, 16 and 18 for selecting the memory unit; a plurality of X-holes 20, 22, 24, 26, 28, 30 and 32 for controlling a row path; a data bus line (i.e., local data bus (LDB) line and a global data bus (GDB) line) which is used as a path means for reading a data of the memory unit or writing a data in the memory unit; and a global data bus (GDB) sense-amp for amplifying the data loaded on the global data bus line.

Each memory unit is comprised of 256 row word lines and 104 column bit line pairs. A memory unit of a row (X) decoder side is comprised of a word line of 256-row and a bit line pair of 88-column.

Here, the local data bus line is connected to a bit line, and the global data bus line is connected to a global data bus sense-amp.

Also, a symbol bs_X indicates a signal for connecting a local data bus line to a global data bus line by n-channel metal-oxide semiconductor (NMOS) transistor (not shown), symbols BisL (i.e., block isolation selection low) and BisH (i.e., block isolation selection high) indicate signals for connecting a bit line to a bit line sense-amp by NMOS transistor (not shown).

FIG. 2 is a detailed circuit diagram of "A" part of FIG. 1, and illustrates a structure according to a folded bit line method. FIG. 3 is a timing diagram of signals related to FIGS. 1 and 2.

Referring to FIGS. 2-3, if one word line W/L(n) among word lines of a sub block (e.g., this is set to a sub block 15) selected by a row address combination is enabled, data of a cell involved to the enabled word line are loaded on each bit line and each bit line bar, receive an amplification operation of a bit line sense-amp by an active operation of block isolation selection signals BisH(16) and BisL(15), and are loaded on a plurality of local data bus lines by a column line Yi (n) selected by a column (Y) address.

The data loaded on the local data bus line are loaded on a global data bus (GDB) line through a plurality of switches T1, T2, T3 and T4 being opened by an active operation of signals bs_X(15) and bs_X(16) which are both signals toward the selected sub block 15.

According to the above data bus line control method, only one operation between 8K refresh operation and 4K refresh operation can be achieved.

In other words, since global data bus (GDB) lines are connected to local data bus (LDB) lines of all 256K sub blocks, 8K refresh operation is possible, but 4K refresh operation is impossible. That is, operation simultaneously selecting other block cannot be achieved.

For example, if the two blocks 256k_block(0) and 256k_block(16) are simultaneously selected, a global data bus line connected to a local data bue line involved to a block 256k_block by signals bs_X0 and bs_X1 is connected to a local data bus line of 256k_block side by signals bs_X16 and bs_X17. As a result, a data collision occurs in a 4K refresh mode structure wherein two blocks are simultaneously selected.

SUMMARY OF THE INVENTION

Accordingly, the present invention is directed to a data bus line control circuit that substantially obviates one or more of the problems due to limitations and disadvantages of the related art.

It is an objective of the present invention to provide a data bus line control circuit which prevents a problem of a data access operation on a global data bus (GDB) line although two blocks are simultaneously selected.

To achieve the above objectives, a data bus line control circuit according to the present invention includes: a global data bus line which is arranged between memory units adjacent to each other as two pairs, and transmits a data from a local data bus line positioned between adjacent sub blocks; and transmission means which is connected between the local data bus line and the global data bus line, and transmits bit line signals of two sub blocks, amplified by a bit line sense-amp, to one pair of global data bus lines different from each other through the local data bus line, when the two sub blocks are simultaneously selected by a block isolation selection signal.

Additional features and advantages of the invention will be set forth in the description which follows, and in part will be apparent from the description, or may be learned by practice of the invention. The objective and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

Further objects and other advantages of the present invention will become apparent from the following description in conjunction with the attached drawings, in which:

FIG. 2 is a detailed circuit diagram of "A" part of FIG. 1;

FIG. 3 is a timing diagram of signals related to FIGS. 1 and 2;

FIG. 6 is a timing diagram of signals related to FIGS. 4 and 5.

DETAILED DESCRIPTION OF THE PREFERRED EMBODIMENT

A preferred embodiment of the present invention will now be described in detail with reference to the accompanying drawings.

Figure 1:
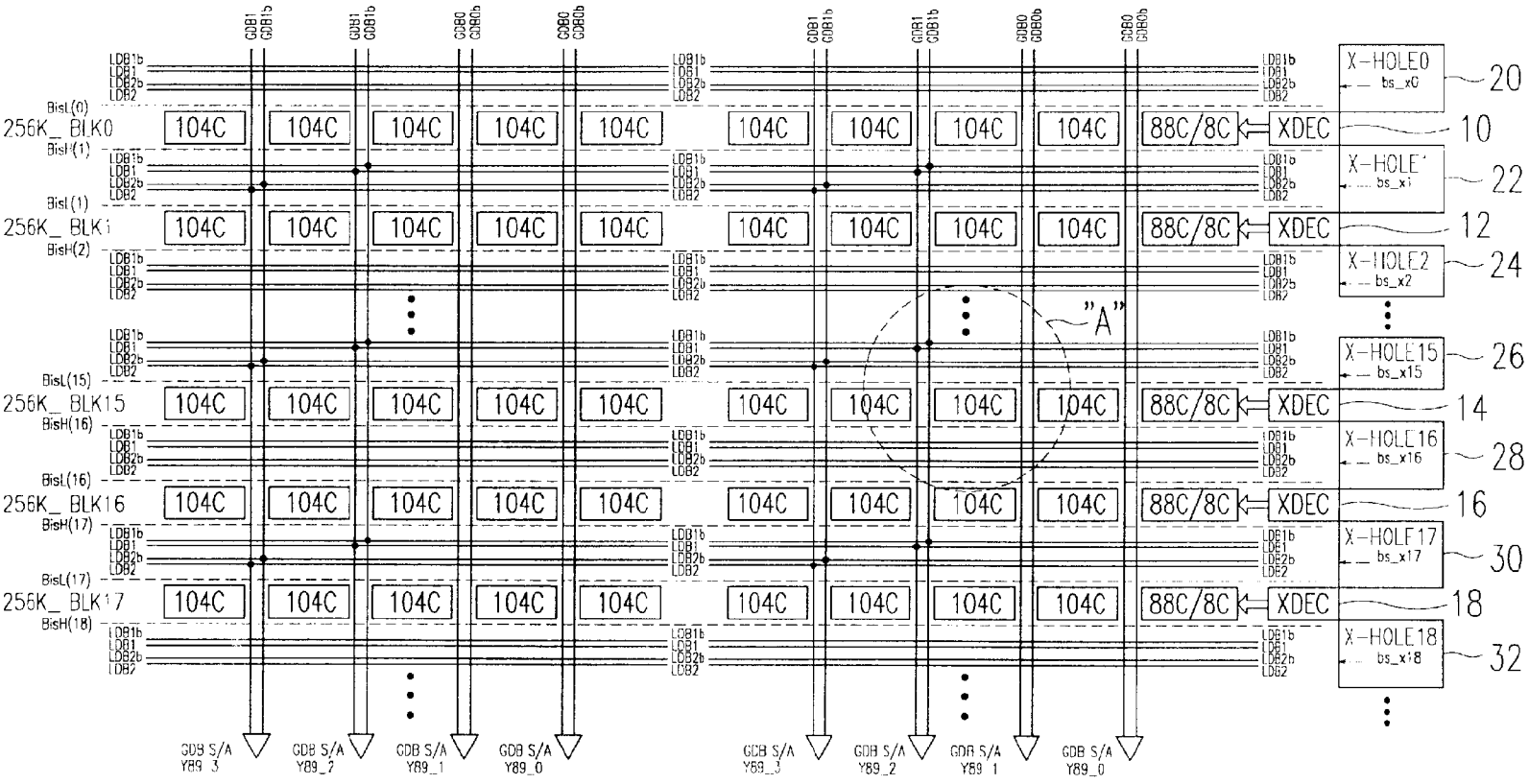
Fig. 1 (prior art)
FIG. 1 schematically illustrates a general connection method between a local data bus line and a global data bus line.
Figure 4:
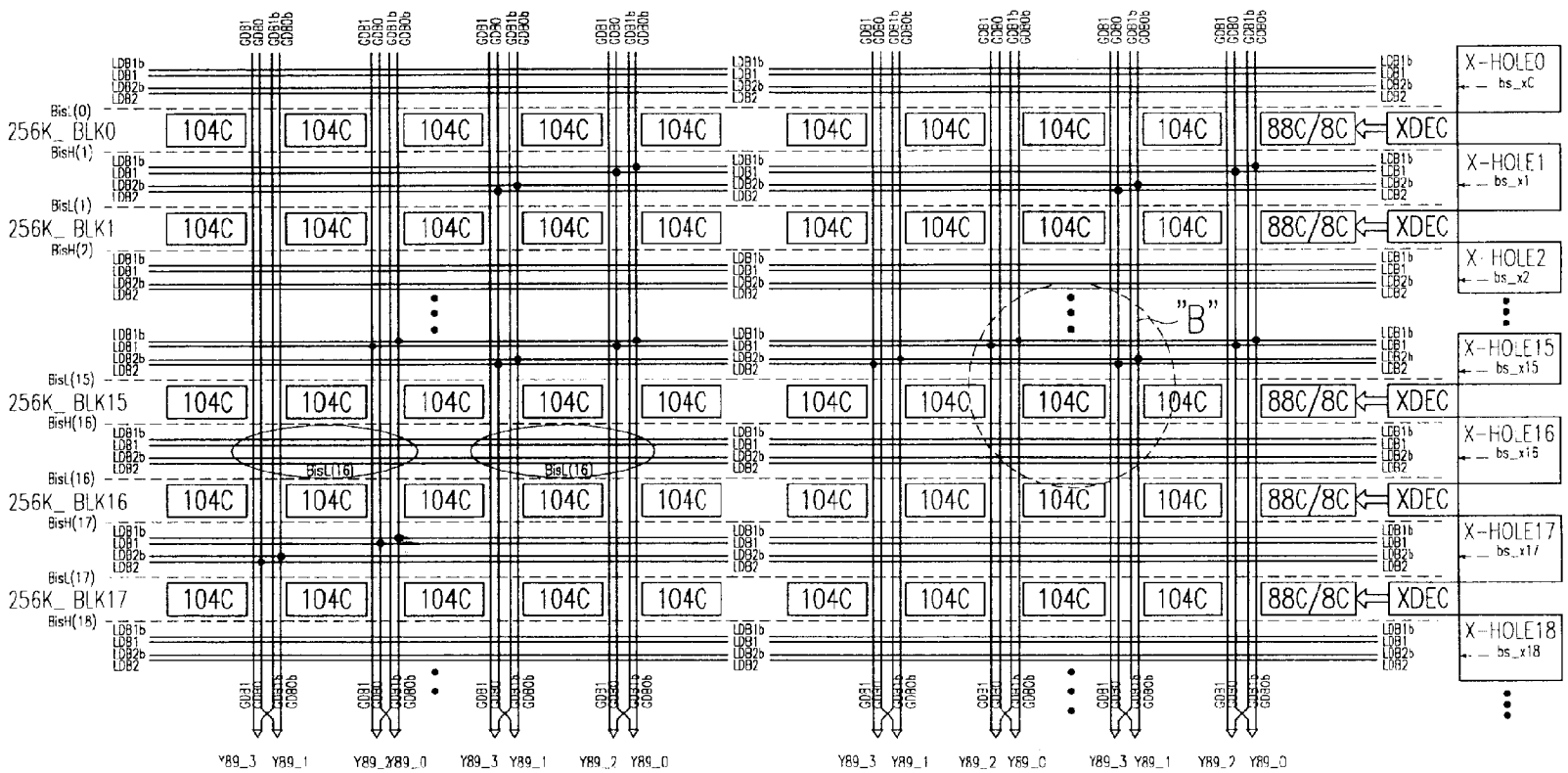
FIG. 4 schematically illustrates a data bus line control circuit according to a preferred embodiment of the present invention.

FIG. 4 schematically illustrates a data bus line control circuit according to a preferred embodiment of the present invention. Referring to FIG. 4, each sub block are divided into two halves, and global data bus lines GDB1, GDB1b, GDB0 and GDB0b are then used. In a middle sub block's hole used as a boundary, an upper adjacent block and a lower adjacent block share the global data bus lines.

Figure 5:
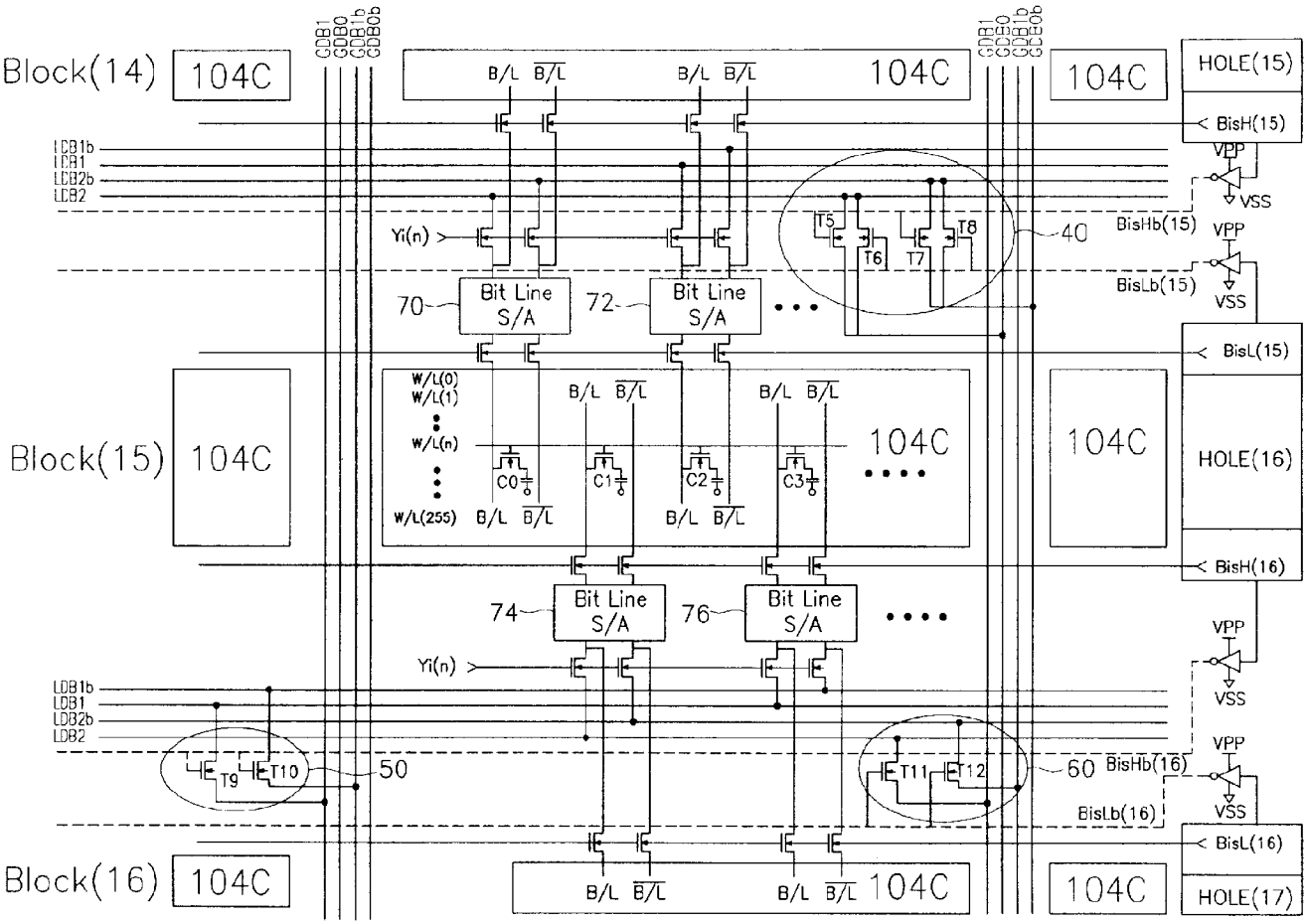
FIG. 5 is a detailed circuit diagram of "B" part of FIGS. 4.

FIG. 5 is a detailed circuit diagram of "B" part of FIG. 4. Referring to FIG. 5, a plurality of local data bus lines LDB1b, LDB1, LDB2b and LDB2 and a plurality of global data bus lines GDB1, GDB0, GDB1b and GDB0b are installed in the vicinity of a sub block 15 of a memory unit. Here, local data bus lines LDB2b and LDB2 positioned at upper and lower parts of the sub block 15 are connected to the global data bus lines GDB1, GDB1b, GDB0 and GDB0b positioned at the right side of the sub block 15 through the medium of transmission means 40 and 60.

A plurality of data bus lines GDB1 and GDB1b installed to left and right sides of the sub block 15 are connected to the local data bus lines LDB1b, LDB1, LDB2b and LDB2 positioned at the lower side of the bus block 15 through the medium of transmission means 50 and 60.

The transmission means 40 is comprised of a first MOS element pair T5 and T6 and a second MOS element pair T7 and T8. Each of the first MOS element pair T5 and T6 and the second MOS element pair T7 and T8 is comprised of NMOS transistors. Gate terminals of the NMOS transistors T5 and T7 receive a block isolation selection signal BisHb (15) as an input. Gate terminals of the NMOS transistors T6 and T8 receive a block isolation selection signal BisLb(15) as an input.

The transmission means 50 is comprised of a plurality of MOS elements (i.e., NMOS transistors) T9 and T10. Gate terminals of the NMOS transistors T9 and T10 receive a block isolation selection signal BisHb(16) as an input.

The transmission means 60 is comprised of a plurality of MOS elements (i.e., NMOS transistors) T11 and T12. Gate terminals of the NMOS transistors T11 and T12 receive a block isolation selection signal BisHb(16) as an input.

Operations of the bus line control circuit according to a preferred embodiment of the present invention will now be described below.

First, if the sub block 15 is selected, the data can receive an amplification operation of a plurality of bit line sense-amps 70, 72, 74 and 76 by an active operation of block isolation selection signals BisH(16) and BisL(15), and are loaded on a plurality of local data bus lines LDB by a column line Yi(n) selected by a column (Y) address.

At this time, block isolation selection signals BisH and BisL adjacent to the selected sub block (e.g., this is set to a sub block 15) are only changed to an inactive level VSS. Block isolation selection signals BisH and BisL toward the selected sub block 15 and another block isolation selection signals BisH and BisL not adjacent to the selected sub block 15 are always at an active level VPP.

For example, if the sub block 15 is selected, the block isolation selection signals BisL(15) and BisH(16) become a VPP level as shown in FIG. 6, and connect the bit lines of the sub block 15 to the bit line sense-amps 70, 72, 74 and 76 of both sides of the sub block 15. The block isolation selection signals BisH(15) and BisL(16) adjacent to the sub block 15 are changed to a VSS level as shown in FIG. 6, and prevents that the bit lines involved to the blocks 14 and 16 adjacent to the sub block 15 are influenced on the bit line sense-amps 70, 72, 74 and 76 of both sides of the sub block 15.

Accordingly, if a certain sub block is selected, other block isolation selection signals BisH and BisL excepting block isolation selection signals BisH and BisL adjacent to the selected sub block maintain a VPP level, and only the block isolation selection signals BisH and BisL adjacent to the selected sub block become a VSS level. If the block isolation selection signals BisH and BisL changed to the VSS level are inverted and transmitted to the transmission means 40, 50 and 60, local data bus lines are connected to global data bus lines by the transmission means 40, 50 and 60.

That is, the transmission means 40 is functioned as a switch controlling such operation. If a sub block 14 is selected, local data bus lines are connected to global data bus lines by block isolation selection signals BisLb(15) and BisHb(14) (not shown).

Other parts excepting a control circuit for local data bus (LDB) and global data bus (GDB) between the sub block 15 and the sub block 16 are the same as the transmission means 40. The control circuit for local data bus (LDB) and global data bus (GDB) between the sub block 15 and the sub block 16 is constructed in consideration of 8K refresh and 4K refresh.

If the sub block 15 is selected, a local data bus (LDB) line is connected to a global data bus (GDB) line by an operation of the transmission means 60. If the sub block 16 is selected, a local data bus (LDB) line is connected to a global data bus (GDB) line by an operation of the transmission means 50. As a result, although one sub block is selected or two sub blocks are simultaneously selected, there is no problem in an access operation of the global data bus (GDB) line.

As described above, since the present invention simplifies a construction of a hole being the most complicated part in a semiconductor memory (e.g., DRAM), a circuit arrangement and a layout design become simplified, and two operations of 8K refresh and 4K refresh are possible in one chip. Accordingly, two kinds of effects can be achieved by one chip.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A data bus line control circuit, comprising:

[a] *two pairs of* global data bus [line which is] *lines* arranged between *adjacent* memory units [adjacent to each other as two pairs, and transmits a] *transmitting* data from a *plurality of* local data bus [line] *lines* positioned between adjacent sub blocks; and transmission means [which is] connected between the local data bus [line] *lines* and the global data bus [line, and transmits] *lines transmitting in a first mode of operation* bit line signals of two sub blocks, amplified by a *plurality of* bit line [sense-amp] *sense-amps*, to [one pair] *both pairs* of global data bus lines different from each other through [the] local data bus [line] *lines*, when the two sub blocks are simultaneously selected by [a] block isolation selection [signal] *signal, and transmitting in a second mode of operation bit line signals of one sub block, amplified by a plurality of bit line sense-amps, to at least one pair of the global data bus lines through local data bus lines, when the one sub block is selected by the block isolation selection signal.*

2. A data bus line control circuit according to claim 1, wherein: a block isolation selection signal of a sub block adjacent to the selected sub blocks becomes inactivated, and a block isolation selection signal of a sub block not adjacent to the selected sub [block] *blocks* becomes activated.

3. A data bus line control circuit according to claim 1, wherein:

the transmission means is controlled by a signal of inverting the block isolation selection signal.

4. A data bus line control circuit according to claim 3, wherein:

the transmission means is comprised of a plurality of metal-oxide semiconductor (MOS) elements of which gate terminals receive the inverted block isolation selection signal as an input.

*5. A data bus line control circuit according to claim 1, wherein: the first and second modes of operation are refresh operations.*

*6. A data bus line control circuit according to claim 5, wherein: the first mode of operation has half a number of refresh cycles of the second mode of operation.*

*7. A data bus line control circuit according to claim 6, wherein: the first mode of operation has 4k refresh cycles and the second mode of operation has 8k refresh cycles.*

*8. A data bus line control circuit according to claim 1, wherein: the transmission means is comprised of a plurality of NMOS transistors.*

*9. A data bus line control circuit according to claim 8, wherein: the block isolation selection signals have a Vss level when inactive and a Vpp level when active.*

*10. A data bus line control circuit according to claim 8, wherein: the block isolation selection signals have a Vss level when inactive and a Vpp level when active.*

* * * * *